United States Patent
Lambrache et al.

(10) Patent No.: US 7,224,610 B1
(45) Date of Patent: May 29, 2007

(54) LAYOUT REDUCTION BY SHARING A COLUMN LATCH PER TWO BIT LINES

(75) Inventors: Emil Lambrache, Campbell, CA (US); Duncan Curry, Sunnyvale, CA (US); Richard F. Pang, Milpitas, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/325,132

(22) Filed: Jan. 3, 2006

(51) Int. Cl.
*G11C 16/04* (2006.01)

(52) U.S. Cl. ............................ 365/185.18; 365/185.25; 365/185.33

(58) Field of Classification Search ........... 365/185.17, 365/185.18, 185.23, 185.25, 185.33, 189.05, 365/230.08
See application file for complete search history.

(56) References Cited

U.S. PATENT DOCUMENTS

| | | | |
|---|---|---|---|
| 5,646,890 A | 7/1997 | Lee et al. | 365/185.11 |
| 5,892,713 A | 4/1999 | Jyouno et al. | 365/185.11 |
| 6,069,710 A * | 5/2000 | Lee | 358/1.9 |
| 6,800,882 B2 | 10/2004 | Dillon et al. | 257/204 |
| 7,046,554 B2 * | 5/2006 | Lee | 365/185.18 |
| 2005/0213378 A1* | 9/2005 | Chang | 365/185.03 |

* cited by examiner

*Primary Examiner*—Gene N. Auduong
(74) *Attorney, Agent, or Firm*—Schneck & Schneck; Thomas Schneck

(57) ABSTRACT

Increasing levels of integration in successive generations of semiconductor memory products are possible through minimal metal-one layout pitches. An optimal bitline layout pitch in metal-one greatly exceeds an ability to match the pitch in a layout of a corresponding array of bitline-coupling-control latches. One latch controlling coupling for two bitlines alleviates the layout problem. In order for one latch to control coupling of two bitlines a logical segregation of the addressing of even and odd bitlines is necessary along with an additional odd or even bitline selection device in series with the selection device managed by the coupling control latch. With the use of a logical-to-physical address mapping and even-odd bitline selection, a single coupling control latch is able to manage one of two bitlines at a time. One latch serving two bitlines makes possible a bitline pitch attaining a maximum layout density possible for a fabrication process.

13 Claims, 6 Drawing Sheets

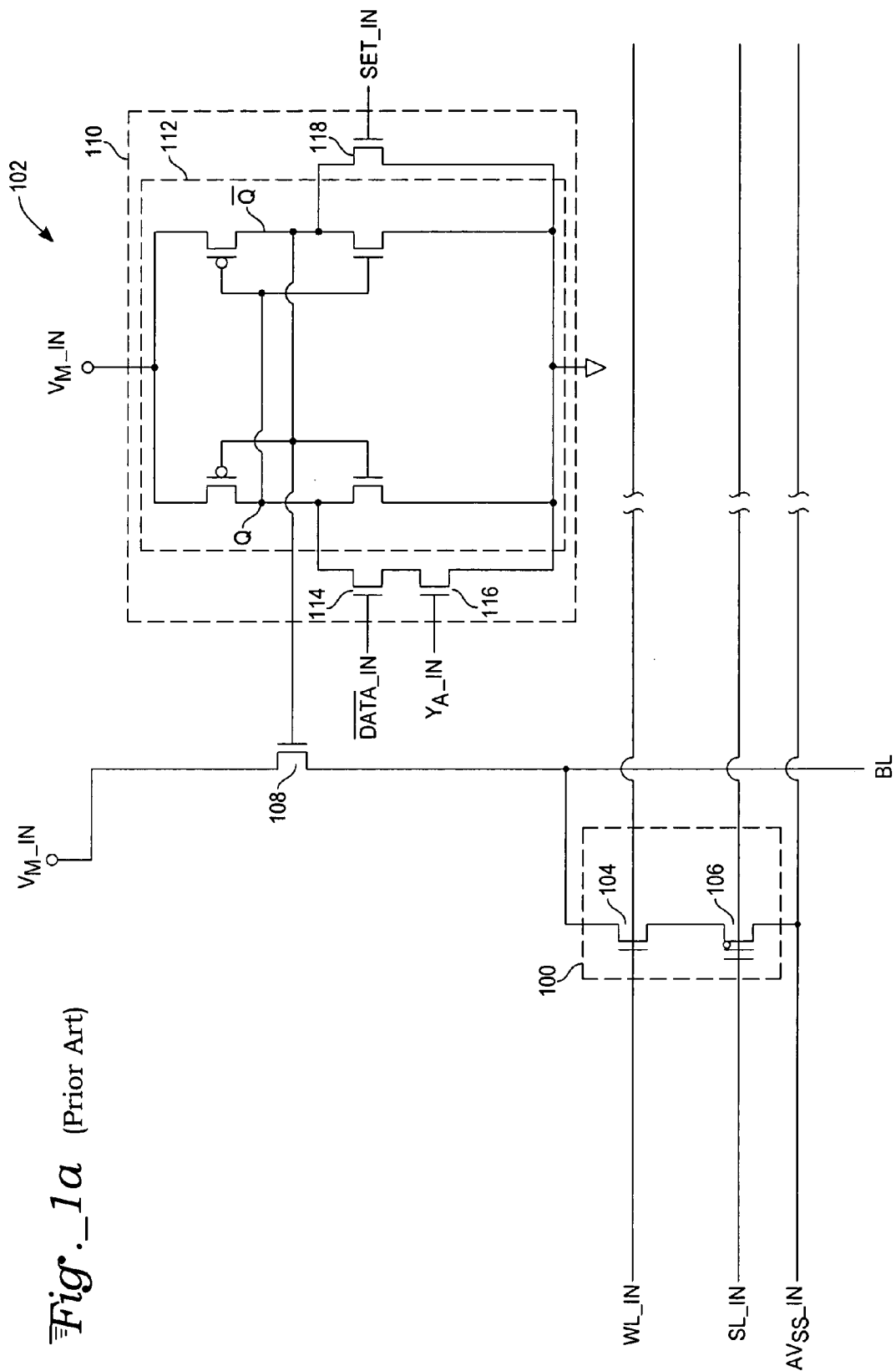
Fig._1a (Prior Art)

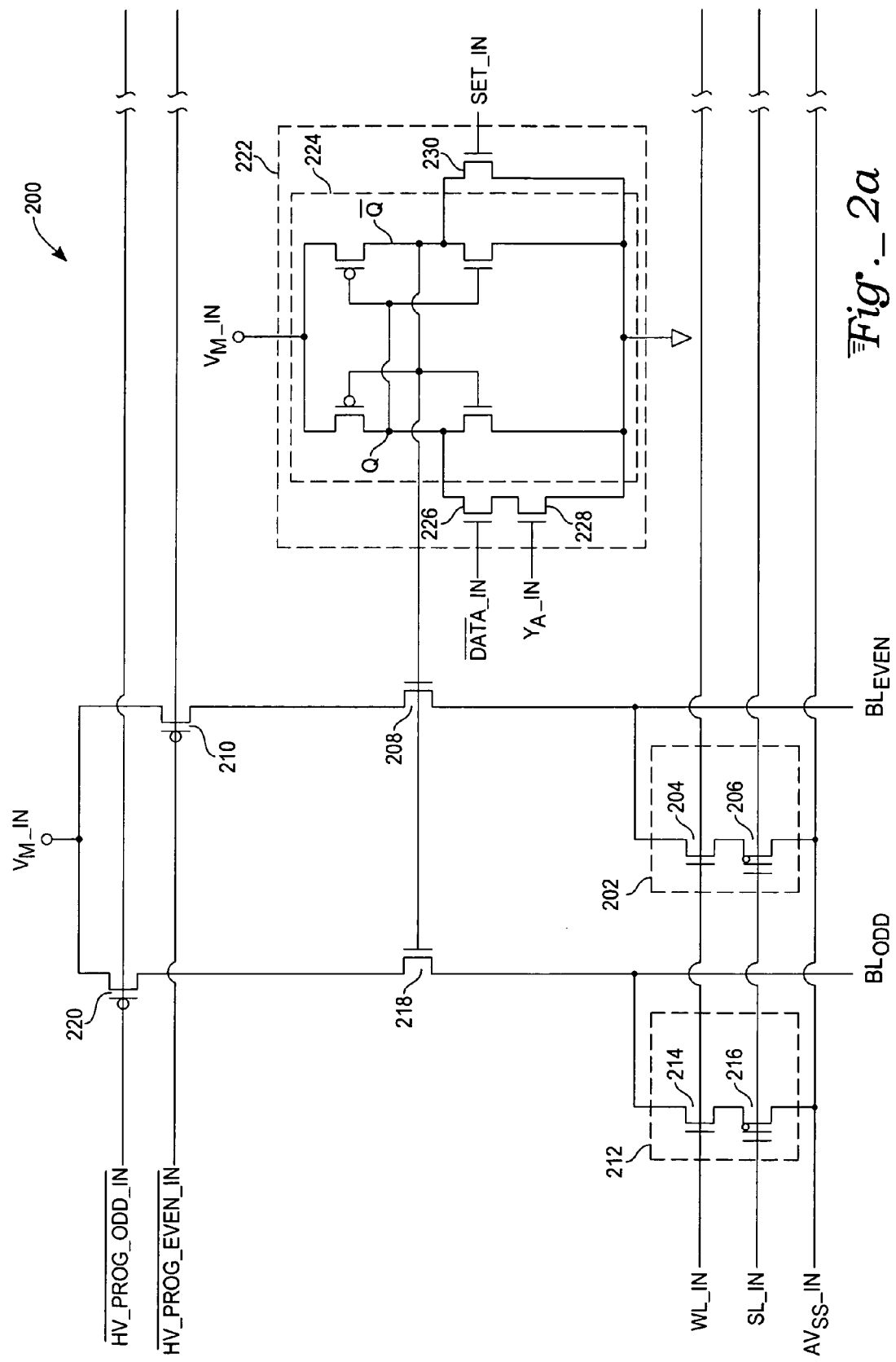
Fig._2a

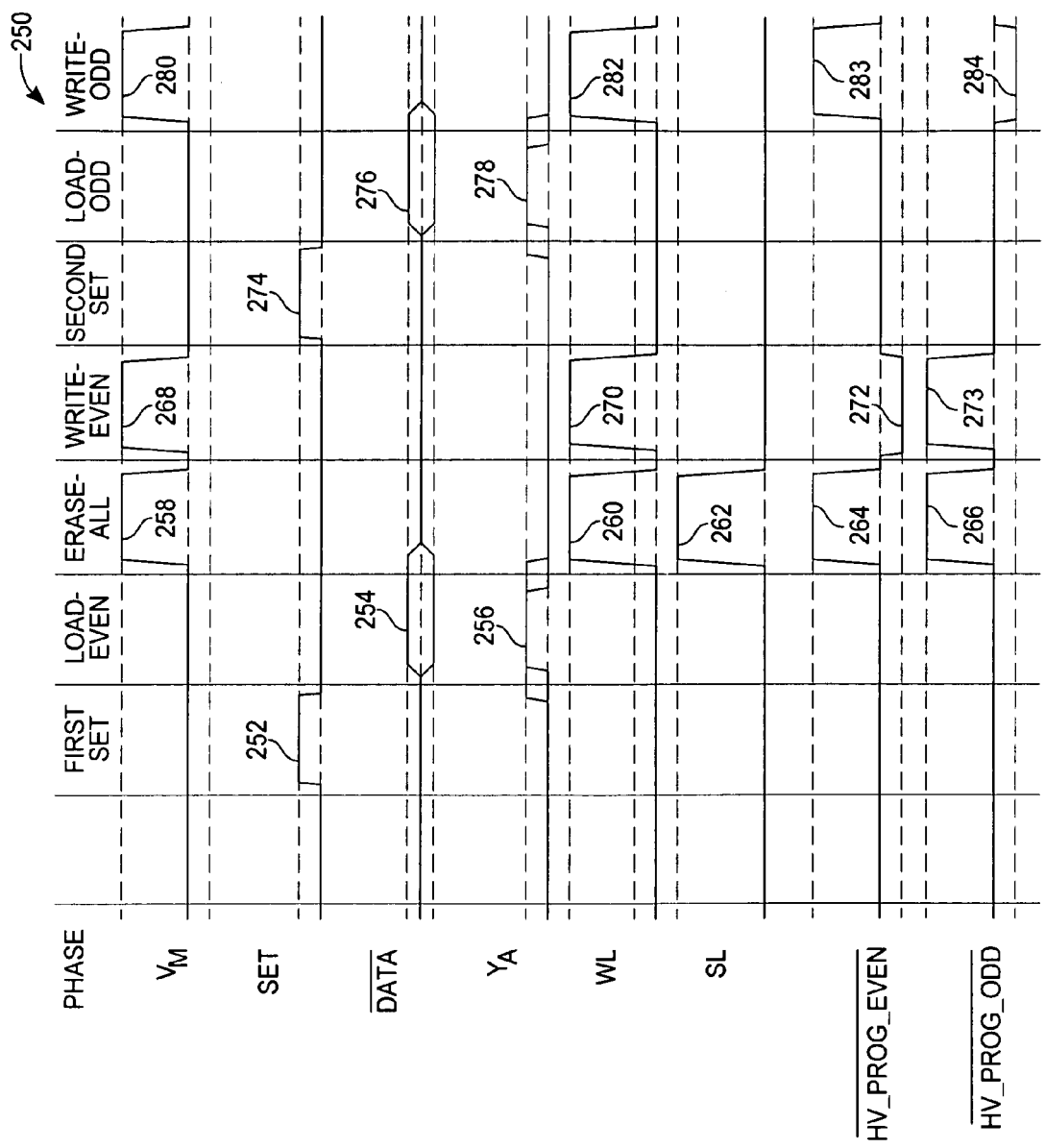
Fig._2b

ADDRESS MAPPING

| PHYSICAL | 0 | 1 | 2 | 3 | 4 | 5 | 6 | 7 | 8 | ... | 122 | 123 | 124 | 125 | 126 | 127 |
|---|---|---|---|---|---|---|---|---|---|---|---|---|---|---|---|---|
| LOGICAL | 64 | 1 | 65 | 2 | 66 | 3 | 67 | 4 | ... | 61 | 125 | 62 | 126 | 63 | 127 |

Fig._3

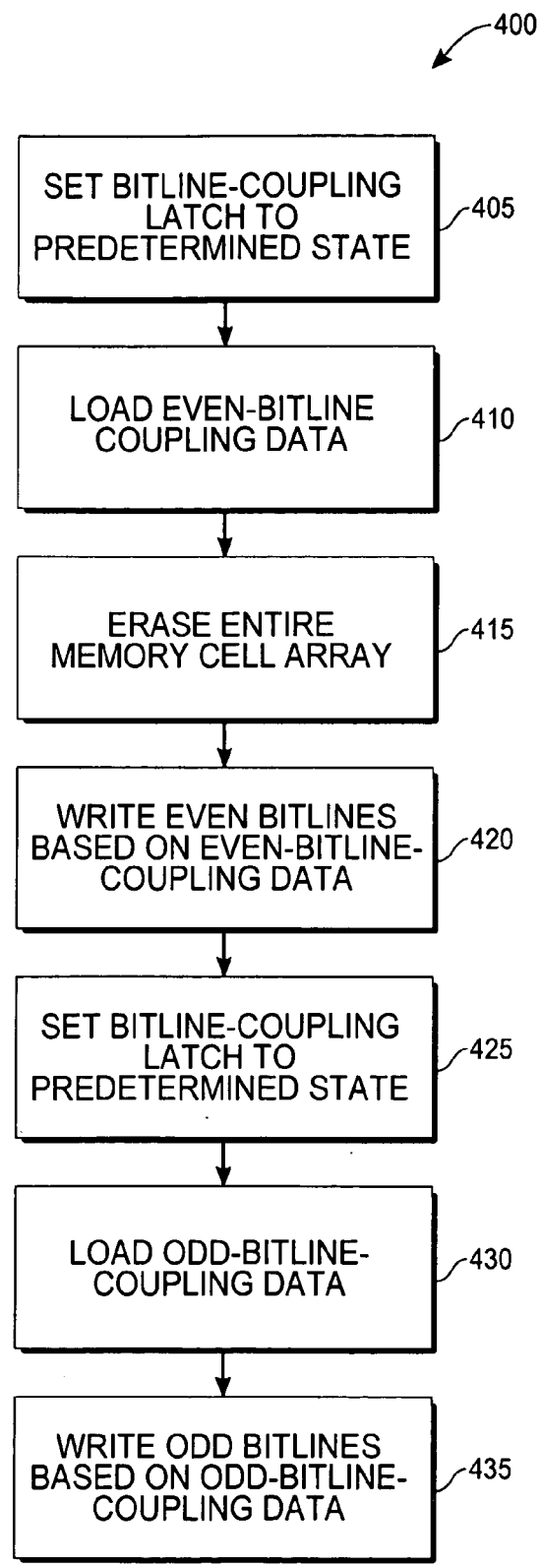
Fig._4

LAYOUT REDUCTION BY SHARING A COLUMN LATCH PER TWO BIT LINES

TECHNICAL FIELD

The present invention relates generally to semiconductor memories and particularly to a control circuit for selection of bitline pairs. More specifically, the present invention relates to programming circuitry for selectively coupling bitline pairs to electrically alterable memory cells.

BACKGROUND ART

EEPROMs (electrically erasable programmable read only memories) have become popular for storing information and retaining data even without power being supplied to a device. Retention of data across power cycles makes an EEPROM popular in consumer electronics products. EEPROMs are used in a broad spectrum of consumer, automotive, telecommunication, medical, industrial and PC related markets. The EEPROM is primarily used to store personal preference, configuration, and setup data in electronic systems. Not needing power supply support for memory retention means that EEPROMs offer a lower pin count, smaller packages, lower voltages, as well as lower power consumption compared to memory devices requiring constant power and refreshing of storage contents.

With reference to FIG. 1a, a bitline BL connects to an electrically alterable memory cell 100 in a prior art schematic diagram of an electrically alterable memory cell array programming apparatus 102. The schematic diagram 102 is representative of a small portion of a memory array of an EEPROM. The electrically alterable memory cell 100 is comprised of a select transistor 104 connected in series with a memory transistor 106. A drain input of the select transistor 104 is connected as an input to the electrically alterable memory cell 100. A source output of the memory transistor 106 is connected as an output to the electrically alterable memory cell 100.

The input to the electrically alterable memory cell 100 is connected to the bitline BL and the output of the electrically alterable memory cell 100 is connected to an array $V_{SS}$ AV$_{SS}$_IN. A wordline WL_IN connects to a gate of the select transistor 104 and a sense line SL_IN connects to a gate of the memory transistor 106. The bitline BL may connect to a plurality of memory cells (not shown) like the electrically alterable memory cell 100. The plurality of cells is arranged to form an array of electrically alterable memory cells.

The bitline BL connects to a source output of a bitline-select transistor 108. A drain input of the bitline-select transistor 108 connects to a programming-voltage node $V_M$_IN.

A bitline-coupling latch 110 is comprised of a pair of cross-coupled inverters forming a latch loop 112. Outputs of the latch loop 112 are a latch output Q and a complementary latch output $\overline{Q}$. A source of power for the latch loop 112 is provided by the programming-voltage node $V_M$_IN.

The latch loop is programmed to a logic level 0 by providing a low-resistance path through a series connection of a $\overline{DATA}$ transistor 114 and a Y-address transistor 116 from the latch output Q to ground. Complementary data are received at a $\overline{DATA}$ input $\overline{DATA}$_IN of the $\overline{DATA}$ transistor 114 and Y-address information is received at a Y-address input $Y_A$_IN of the Y-address transistor 116. The latch loop 112 is programmed to a logic level 1 by providing a low-resistance path through a series connection of a set transistor 118 from a complementary latch output $\overline{Q}$ to ground. The latch loop 112 is programmed by applying a logic level 1 to the set input SET_IN of the set transistor 118. The complementary latch output $\overline{Q}$ connects to a gate input of the bitline-select transistor 108.

With reference to FIG. 1b, a waveform diagram of a prior art programming cycle 150 for an electrically alterable memory cell 100 (FIG. 1a) begins with a set pulse 152 of a set signal SET rising from 0 V (Volts) to 3 V during a SET-LATCH phase. The set pulse 152 is applied to the set input SET_IN (FIG. 1a) which causes the bitline-coupling latch 110 to store the logic level 1.

The SET-LATCH phase is followed by a LOAD phase in the programming cycle 150. In a LOAD phase a logic level 0 is set in the latch loop 112 (the complementary latch output $\overline{Q}$ is a logic level 1) when data are to be programmed into a memory cell. During the LOAD phase a $\overline{DATA}$ pulse 154 at a high logic level is applied to the $\overline{DATA}$ input $\overline{DATA}$_IN and a Y-address pulse 156 at a high logic level is applied concurrently to the Y-address input $Y_A$_IN. Application of the $\overline{DATA}$ pulse 154 and the Y-address pulse 156 to the respective transistor-control inputs produces a low-resistance path through the $\overline{DATA}$ transistor 114 and the Y-address transistor 116 from the latch-loop output Q to ground and sets the latch loop 112 to a logic level 0 state.

The LOAD phase is followed by an ERASE phase. The programming voltage $V_M$ rises from 3 V to a 12 V level in a first high-voltage-programming pulse 158 in the ERASE phase. To erase the electrically alterable memory cell 100 a first wordline pulse 160 from 0 V to 12 V of the wordline signal WL is applied to the wordline WL_IN and a sense-line pulse 162 from 0 V to 12 V of the sense-line signal SL is applied to the sense line SL_IN.

Following the ERASE phase a WRITE phase contains a second high-voltage-programming pulse 164 that transitions from 3 V to 12 V and back to 3 V by the end of the WRITE phase. To select the electrically alterable memory cell 100 for programming, a second wordline pulse 166 from 0 V to 12 V and a second high-voltage-programming pulse 164 are applied.

The programming cycle 150 is normally followed by a READ operation. In the READ operation a connection of the bit line BL is provided to a sense amplifier (not shown) so that transistor 106 produces a current to be read by the sense amplifier.

During development of semiconductor fabrication processes, dimensions and features shrink from one generation to the next as a process is scaled down to achieve an increase in production efficiency. A first metal layer (metal-one) wiring pitch forms a limit for routing bitlines in a minimum area. Control of bitline coupling has dictated there be a latch per bit line for programming. Even with a scaling in layout, latches in a present generation of fabrication process take far more area than a corresponding set of bitlines being coupled to by the latches. Various orientations of latches as well as the use of a polysilicon layer for use in intra-cell connections has been tried as a solution to minimize the mismatch between a latch array and a minimum bitline routing pitch. Use of vias from metal-one to metal-two (second metal layer) has been considered; but a resultant metal-one wiring pitch is inefficient relative to a possible pitch available in the semiconductor process. Efforts with latch layout orientation, metal-one to metal-two vias, and the use of polysilicon have not been sufficient to solve an inefficiencies layout described.

A solution is needed that will allow the use of the tightest possible metal-one pitch that the fabrication process allows and simultaneously provide a lessening of the impact of having latch-based control of bitline coupling. Incorporation of the solution needs to be done in a manner transparent to the user and done in a way that can avoid the need to provide additional area to accommodate a latch beyond the area required for a minimum bitline pitch. Maintaining an optimal bitline pitch possible avoids low utilization of layout area for a latch-bitline combination and avoids having that inefficiency multiplied by the thousands of possible occurrences of the situation in a memory array.

SUMMARY

During a course of scaling semiconductor layout features in successive generations of semiconductor nonvolatile memory products, minimal metal-one layout pitches are made possible by layout design rules for a given generation of semiconductor fabrication process. An optimal bitline layout pitch in the minimal metal-one layout pitch possible greatly exceeds an ability to layout a corresponding array of bitline-coupling-control latches in a matching pitch. Different latch layout options have been pursued, including the use of metal-one to metal-two vias for groupings of bitlines to access a corresponding set of latches. An impact of an increase in a bitline pitch due to a use of vias multiplied by a large number of occurrences in a memory array means that a significant layout inefficiency results.

Sharing a latch for each pair of neighboring bitlines solves a part of the problem due to layout; yet requires innovation for addressing a full set of bitlines in a manner transparent to a user. An even-odd alternation of logical-to-physical addresses in a memory array and an accompanying alternation of bitline coupling to programming voltages allows use of one latch per bitline pair. A selective connection to programming-voltage nodes and a loading of a plurality of bitline-coupling-control latches to enable access to read or write voltages by only an even or an odd set of bitlines at a time allows one latch to serve two bitlines. With one latch utilized per two bitlines layout inefficiencies of bitlines are avoided in thousands of instances present in a typical memory array and a full potential for an optimal layout efficiency that the layout design rules may provide is fulfilled.

BRIEF DESCRIPTION OF DRAWINGS

FIG. 1a is a prior art schematic diagram of an electrically alterable memory cell array programming apparatus.

FIG. 2a is a diagram of an exemplary electrically alterable memory cell array programming apparatus.

FIG. 2b is a waveform diagram of an exemplary programming cycle of an electrically alterable memory cell array programming apparatus.

FIG. 3 is a diagrammatic mapping of logical-to-physical addresses of an exemplary electrically alterable memory cell array programming apparatus.

FIG. 4 is an exemplary method of programming an electrically alterable memory cell.

DETAILED DESCRIPTION

Figure 1B:
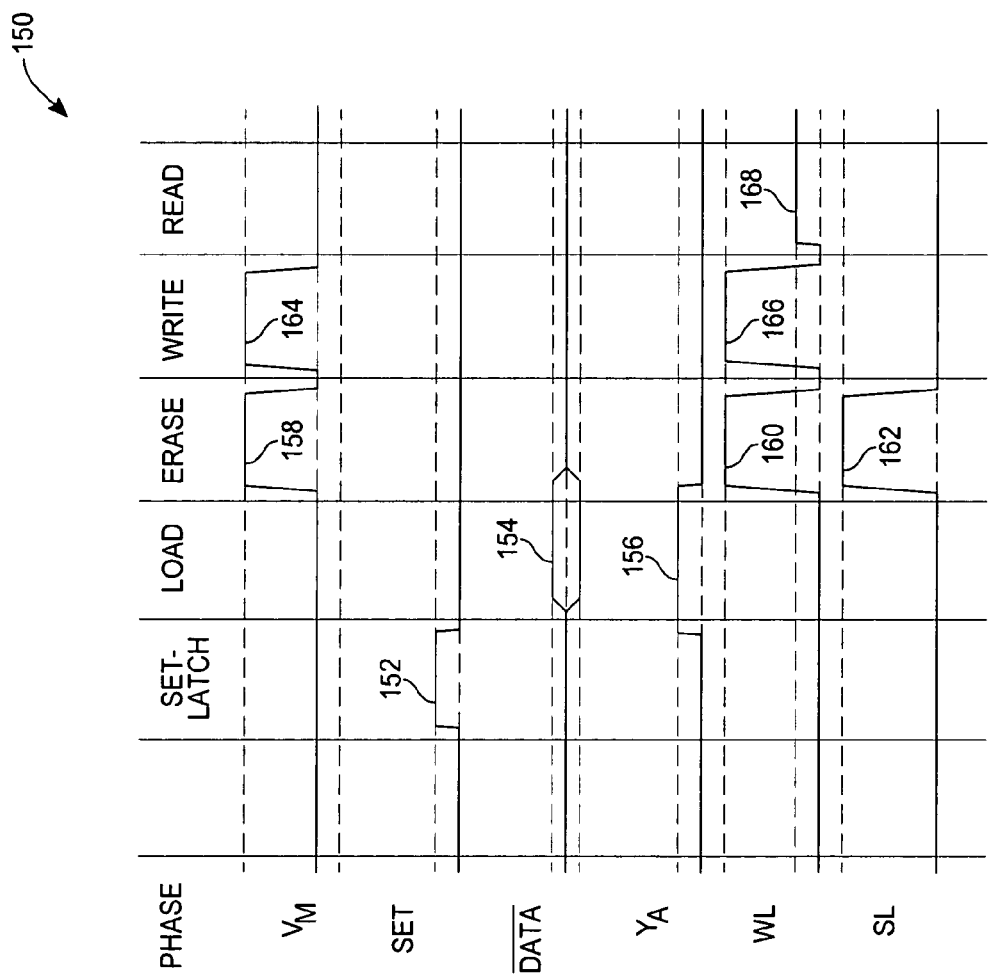
FIG. 1b is a waveform diagram of a prior art programming cycle for an electrically alterable memory cell.

With reference to FIG. 2a, an odd bitline $BL_{ODD}$ and an even bitline $BL_{EVEN}$ form a bitline pair in a schematic diagram of an exemplary electrically alterable memory cell array programming apparatus 200. The even bitline $BL_{EVEN}$ connects, for example, to an even electrically alterable memory cell 202. The even electrically alterable memory cell 202 is comprised of an even-select transistor 204 connected in series with an even-memory transistor 206. For example, a drain input of the even-select transistor 204 is connected as an input to the even electrically alterable memory cell 202. A source output of the even-memory transistor 206 is connected, for example, as an output to the even electrically alterable memory cell 202.

The input to the even electrically alterable memory cell 202 is connected to the even bitline $BL_{EVEN}$ and the output of the even electrically alterable memory cell 202 is connected to an array $V_{SS}$ $AV_{SS}\_IN$. A wordline WL_IN connects to a gate of the even-select transistor 204 and a sense line SL_IN connects to a gate of the even-memory transistor 206. The even bitline $BL_{EVEN}$ may connect, for example, to a plurality of memory cells (not shown) like the even electrically alterable memory cell 202. The plurality of cells is arranged to form an array of electrically alterable memory cells (not shown).

The even bitline $BL_{EVEN}$ connects to a source output of a second even-bitline-select transistor 208. A drain input of the second even-bitline-select transistor 208 connects to a drain output of a first even-bitline-select PMOS transistor 210. A programming-voltage node $V_M\_IN$ connects to a source input of the first even-bitline-select PMOS transistor 210.

The odd bitline $BL_{ODD}$ connects, for example, to an odd electrically alterable memory cell 212. The odd electrically alterable memory cell 212 is comprised of an odd-select transistor 214 connected in series with an odd-memory transistor 216. A drain input of the odd-select transistor 214 is connected, for example, as an input to the odd electrically alterable memory cell 212. A source output of the odd-memory transistor 216 is connected, for example, as an output to the odd electrically alterable memory cell 212.

The input to the odd electrically alterable memory cell 212 is connected to the odd bitline $BL_{ODD}$ and the output of the odd electrically alterable memory cell 212 is connected to an array $V_{SS}$ $AV_{SS}\_IN$. A wordline WL_IN connects to a gate of the odd-select transistor 214 and a sense line SL_IN connects to a gate of the odd-memory transistor 216. The odd bitline $BL_{ODD}$ may connect, for example, to a plurality of the odd electrically alterable memory cell 212 where the plurality of cells is arranged to form an array of electrically alterable memory cells (not shown).

The odd bitline $BL_{ODD}$ connects to a source output of a second odd-bitline-select transistor 218. A drain input of the second odd-bitline-select transistor 218 connects to a drain output of a first odd-bitline-select PMOS transistor 220. A programming-voltage node $V_M\_IN$ connects to, for example, a source input of the first odd-bitline-select PMOS transistor 220.

A bitline-coupling latch 222 is comprised of a pair of cross-coupled inverters forming a latch loop 224. The latch-loop outputs are a latch output Q and a complementary latch output $\overline{Q}$. A source of power for the latch loop 224 is provided by the programming-voltage node $V_M\_IN$.

The latch loop is programmed to a logic level 0 by providing a low-resistance path through a series connection of a $\overline{DATA}$ transistor 226 and a Y-address transistor 228 from the latch loop Q output Q to ground. Control input terminals for the $\overline{DATA}$ transistor 226 and the Y-address transistor 228 are a $\overline{DATA}$ input $\overline{DATA}\_IN$ and a Y-address input $Y_A\_IN$. The latch loop 224 is programmed to a logic level 1 by providing a low-resistance path through a series connection of a set transistor 230 from a complementary latch output $\overline{Q}$ to ground. The complementary latch output $\overline{Q}$ connects to a gate input of the second even-bitline-select transistor 208 and the second odd-bitline-select transistor 218.

Two high-voltage-programming inputs connect to selection logic (not shown). An even-high-voltage-programming node $\overline{\text{HV\_PROG\_EVEN\_IN}}$ connects to a gate input of the first even-bitline-select PMOS transistor 210. An odd-high-voltage-programming node $\overline{\text{HV\_PROG\_ODD\_IN}}$ connects to a gate input of the first odd-bitline-select PMOS transistor 220.

With reference to FIG. 2b, a waveform diagram of an exemplary programming cycle 250 begins with a first set pulse 252 of a set signal SET rising from 0 V to 3 V during a FIRST SET phase 252. The first set pulse 250 is applied to the set transistor 230 (FIG. 2a) setting the bitline-coupling latch 222 to the logic level 1. The latch loop 224 is set to a logic level 1 by a low-resistance path being provided through the set transistor 230 from the complementary latch output $\overline{Q}$ to ground. The logic level 1 of the first set pulse 252 is applied to the set input SET_IN which is connected to a gate input of the set transistor 230. Application of the logic level 1 to the set input SET_IN produces the low-resistance path through the set transistor 230, brings the complementary latch output $\overline{Q}$ to a ground voltage level, and sets the latch loop 224 to the logic level 1. Where several bitline pairs and bitline-coupling latches are configured in parallel (not shown), for example, all bitline-coupling latches are set to a logic level 1 at one time. The logic level 1 is a predetermined state for all bitline-coupling latches to be set.

The FIRST SET phase is followed by a LOAD-EVEN phase in the exemplary programming cycle 250. In a loading phase (odd or even) a logic level 0 is set in the latch loop 224 (the latch-loop output $\overline{Q}$ goes to a logic level 0 and the latch output $\overline{Q}$ is a logic level 1) when data are to be programmed into a memory cell. Otherwise the logic level 1 (latch output $\overline{Q}$ is a logic level 0) of the previous set phase is left as the state of the bitline-coupling latch 222 and access is blocked to the even bitline $BL_{EVEN}$ and the odd bitline $BL_{ODD}$.

During the LOAD-EVEN phase a first $\overline{\text{DATA}}$ pulse 254 at a high logic level is applied to the $\overline{\text{DATA\_IN}}$ node of the $\overline{\text{DATA}}$ transistor 226 and a first Y-address pulse 256 at a high logic level is applied concurrently to the $Y_A$_IN node of the Y-address transistor 228. Application of the first $\overline{\text{DATA}}$ pulse 254 and the first Y-address pulse 256 to the respective transistor control input terminals produces a low-resistance path through the $\overline{\text{DATA}}$ transistor 226 and the Y-address transistor 228 from the latch-loop output Q to ground. The low-resistance path to ground sets the latch loop 224 to a logic level 0 state. The Y-address signal $Y_A$ may be applied alternatively in either the LOAD-EVEN phase or in a latter part of the FIRST SET phase and may be sustained past the end of the LOAD-EVEN phase in order to satisfy a setup time requirement of the bitline-coupling latch 222.

The logic level 0 state set in the latch loop 224 produces a high voltage level output at the complementary latch output $\overline{Q}$. The high voltage level output is the 3 V level coming from a programming voltage $V_M$. The programming voltage $V_M$ varies between 3 V and 12 V depending on the phase of the programming cycle. Generally, the 3 V level is maintained to preserve a data content of the memory cells. The programming voltage $V_M$ is 3 V during the FIRST SET phase and the LOAD-EVEN phase.

During the LOAD-EVEN phase, the 3 V level on the latch output $\overline{Q}$ is applied to the second even-bitline-select transistor 208 and the second odd-bitline-select transistor 218, turning them on, which couples the even bitline $BL_{EVEN}$ and the odd bitline $BL_{ODD}$ to the even-bitline-select PMOS transistor 210 and the odd-bitline-select PMOS transistor 220 respectively. The logic level 0 set in the latch loop 224 during a LOAD phase enables the bitlines $BL_{EVEN}$, $BL_{ODD}$ to be coupled to the second bitline select transistors 208, 218.

The LOAD-EVEN phase is followed by an ERASE-ALL phase. The programming voltage $V_M$ applied at a high level is used in write and erase operations on the memory cells. The programming voltage $V_M$ is 3 V during the FIRST SET phase and the LOAD-EVEN phase. A voltage multiplier, such as a Dixon charge pump, raises the voltage supplied as the programming voltage $V_M$ to the high level required for programming which is, for example, 12 V. The programming voltage $V_M$ rises from 3 V to a 12 V level in an erase-all pulse 258 of the ERASE-ALL phase. A first word-line pulse 260 from 0 V to 12 V of the wordline signal WL is applied to the wordline and a sense-line pulse 262 from 0 V to 12 V of the sense-line signal SL is applied to the sense line SL_IN to erase both the odd electrically alterable memory cell 212 and the even electrically alterable memory cell 202.

During the ERASE-ALL phase $AV_{SS}$_IN is actively grounded while the wordline WL_IN and the sense line SL_IN are both at a high voltage level, which allows the memory cells to actively ground all bitlines. A first even-program-voltage-inhibit-pulse 264 and a first odd-program-voltage-inhibit-pulse 266 are asserted on an even-high-voltage-programming signal $\overline{\text{HV\_PROG\_EVEN}}$ and an odd-high-voltage-programming signal $\overline{\text{HV\_PROG\_ODD}}$, respectively. The program-voltage-inhibit-pulses 264 266, applied to the respective devices, ensure that the even-bitline-select PMOS transistor 210 and the odd-bitline-select PMOS transistor 220 remain shutoff which isolates the programming-voltage node $V_M$_IN from both electrically alterable memory cells 202, 212.

Following the ERASE-ALL phase a WRITE-EVEN phase contains a second high-voltage-programming pulse 268 that transitions from 3 V to 12 V and back to 3 V by the end of the WRITE-EVEN phase. To select the even electrically alterable memory cell 202 for programming a second wordline pulse 270 from 0 V to 12 V, for example, and a second even-high-voltage-programming pulse 272 are applied. A second odd-program-voltage-inhibit-pulse 273 is asserted on the odd-high-voltage-programming signal $\overline{\text{HV\_PROG\_ODD}}$ to ensure that the odd-bitline-select PMOS transistor 220 remains shutoff, isolating the programming-voltage node $V_M$_IN from the odd electrically alterable memory cell 212.

The exemplary programming cycle 250 continues with a second set pulse 274 of a set signal SET during a SECOND SET phase. The second set pulse 274 is applied to the set transistor 230 (FIG. 2a), as explained supra, setting the bitline-coupling latch 222 to the logic level The SECOND SET phase is followed by a LOAD-ODD phase. During the LOAD-ODD phase a second $\overline{\text{DATA}}$ pulse 276 at a high logic level is applied to the $\overline{\text{DATA\_IN}}$ node of the $\overline{\text{DATA}}$ transistor 226 and a second Y-address pulse 278 is applied concurrently to the Y-address input $Y_A$_IN of the Y-address transistor 228. The latch loop 224 is programmed to a logic level 0 state. Similarly to the case in the LOAD-EVEN phase, the Y-address signal $Y_A$ may be applied alternatively in either the LOAD-ODD phase or in a latter part of the SECOND SET phase and may be sustained past the end of the LOAD-ODD phase in order to satisfy the setup time requirement of the bitline-coupling latch 222.

The LOAD-ODD phase is followed by a WRITE-ODD phase that contains a third high-voltage-programming pulse 280 that transitions from 3 V to 12 V and back to 3 V by the end of the WRITE-ODD phase. To select the odd electrically alterable memory cell 212 for programming a third wordline pulse 282 from 0 V to 12 V is applied to the wordline WL_IN and a second odd-high-voltage-programming pulse 284 is applied to the even-high-voltage-programming node $\overline{\text{HV\_PROG\_ODD\_IN}}$. A second even-program-voltage-inhibit-pulse 283 is asserted on the even-high-voltage-programming signal $\overline{\text{HV\_PROG\_EVEN}}$ to ensure that the even-bitline-select PMOS transistor 210 remains shutoff, isolating the programming-voltage node $V_M\_\text{IN}$ from the even electrically alterable memory cell 202.

During the READ operation (not shown), both the odd-high-voltage-programming signal $\overline{\text{HV\_PROG\_ODD}}$ and the even-high-voltage-programming signal $\overline{\text{HV\_PROG\_EVEN}}$ are inactive (i.e. at a high voltage level) to disconnect all bit lines from the programming voltage $V_M$. A voltage level high enough to allow both the odd-high-voltage-programming signal $\overline{\text{HV\_PROG\_ODD}}$ and the even-high-voltage-programming signal $\overline{\text{HV\_PROG\_EVEN}}$ to be inactive (i.e. to isolate the programming-voltage node $V_M\_\text{IN}$ from the odd bitline $BL_{ODD}$ and the even bitline $BL_{EVEN}$) is a voltage less than one device threshold below the programming voltage $V_M$. During the READ operation, bit lines are selectively connected through a multiplexer Y-MUX (not shown) to a sense amplifier (not shown).

With reference to FIG. 3, a diagrammatic mapping of logical-to-physical addresses 300 commences with physical address 0 corresponding to logical address 0. An even bitline $BL_{EVEN}$ (FIG. 2a) and an odd bitline $BL_{ODD}$ correspond to each pair of physical addresses with one bitline-coupling latch 222 per pair of bitlines. A progression of logical addresses 0, 1, 2, 3, 4, . . . , 63 is mapped to every other physical address at even locations 0, 2, 4, 6, 8, . . . , 126 for the first 64 logical addresses and is mapped to every other physical address at odd locations 1, 3, 5, 7, . . . , 127 for the second 64 logical addresses 64, 65, 66, 67, . . . , 127. To an external user of a memory system a set of logical addresses for memory access progress in a standard sequence, for example, from 0 to 127 with an increment of one address at a time. By logically sequencing through addresses by an odd physical address sequence and then by an even physical address sequence, the single bitline-coupling latch per pair of bitlines needs to only manage one bitline at a time per even or odd address sequence. An interleaved logical-to-physical address mapping allows the use of one bitline coupling latch per pair of bitlines. Access is possible with a simple logical address sequence that makes the physical sequences transparent to the user.

With reference to FIG. 4, an exemplary method of programming an electrically alterable memory cell 400 commences with a first step of setting 405 a bitline-coupling latch to a predetermined state. The method continues with loading 410 even-bitline-coupling data and erasing 415 an entire memory cell array. A next step is writing 420, for example, a plurality of even bitlines based on the even-bitline-coupling data followed by setting 425 a bitline-coupling latch to the predetermined state. The method concludes with loading 430 odd-bitline-coupling data and writing 435, for example, a plurality of odd bitlines based on the odd-bitline-coupling data.

An apparatus for connecting a single coupling control latch in parallel to a pair of respective select transistors of a bitline pair has been presented as an example of how to reduce an amount of circuitry and an amount of corresponding layout area in a semiconductor device. A corresponding use of even and odd bitlines in alternating sequences has also been presented in a logical-to-physical mapping along with a method of programming a plurality of memory cells connected to bitlines pairs. In this way, half as many bitline-coupling latches are needed as would have been required if the logical addresses mapped one-to-one with the physical addresses. By halving a number of bitline-coupling latches, routing of bitline selection connections between bitline pairs and bitline-coupling latches is greatly simplified. Simplification of routing to bitline-coupling latches means that an amount of area used per bitline pair is not limited by a size requirement to layout the bitline-coupling latches.

Utilizing the present invention an amount of area for laying-out a bitline pair and a corresponding bitline-coupling latch is maintained at an optimal area corresponding to the minimum metal-one routing pitch possible according to a set of layout ground rules for a semiconductor fabrication process. A layout pitch corresponding to the minimal metal-one layout pitch means that extra area that would have been required to accommodate two bitline-coupling latches per bitline pair is not consumed by the number of bitline pairs, which could number many thousands, and thereby not utilize considerable semiconductor die area compared to the layout efficiency possible incorporating the present invention.

While various portions of an exemplary electrically alterable memory cell array programming apparatus have been depicted with exemplary components and configurations, an artisan in the field of electrically alterable memory cells and their programming circuits would readily recognize alternative embodiments for accomplishing a similar result. For instance, a bitline-coupling latch has been represented as a set of cross coupled inverters with series connected NMOS (n-type metal oxide semiconductor) devices for setting a latch state. One skilled in the art would recognize that a storage device may be realized from a master/slave flip-flop with complementary clocking of the two corresponding latch loops to allow a logic level applied to the master latch loop to program the device. While NMOS and PMOS (p-type metal oxide semiconductor) devices have been portrayed as pass gates used as bitline-select transistors, a skilled artisan would readily identify an equivalent functionality provided by complementary PMOS/NMOS transmission gates with complementary control signals as offering the same selection control capability. These and further changes to the structure and fabrication of the present invention are readily contemplated in light of the disclosed material. Therefore, the specification and drawings are to be regarded in an illustrative rather than a restrictive sense.

What is claimed is:

1. A memory-cell-programming apparatus comprising:
a bitline pair includes an even bitline and an odd bitline, the even bitline coupled to an even array of memory cells and the odd bitline coupled to an odd array of memory cells, the bitline pair capable of providing programming voltages to the even array and the odd array of memory cells;
a first pair of bitline selection devices coupled to a programming-voltage node, the first pair of bitline selection devices capable of coupling the bitline pair to a programming-voltage level and configured to alternately couple a single bitline of the bitline pair at a time to the programming-voltage node;
a storage cell capable of storing a single bit of coupling data; and a second pair of bitline selection devices coupled to the first pair of bitline selection devices, the bitline pair, and the storage cell, the second pair of bitline selection devices being configured to select the bitline pair based on the coupling data stored in the storage cell.

2. The memory-cell-programming apparatus of claim 1, further comprising an address decoding means, coupled to the storage cell, for producing a logical-to-physical mapping of memory cell addresses to provide a logical address sequence corresponding to a sequence of physical addresses of either the even array of memory cells or the odd array of memory cells at a time.

3. The memory-cell-programming apparatus of claim 1, further comprising a controller means, coupled to the storage cell, the programming-voltage node, and the first pair of bitline selection devices, for producing a correspondence of loading data to the storage cell, sequencing the programming-voltage level, and alternating a coupling of a single bitline at a time to a programming-voltage level.

4. A memory-cell-programming system comprising:
   a programming-voltage source coupled to a programming-voltage node and capable of producing a programming-voltage level;
   a bitline pair further comprising an even bitline and an odd bitline, the even bitline coupled to an even array of memory cells and the odd bitline coupled to an odd array of memory cells, the bitline pair capable of providing the programming-voltage level to the even array and odd array of memory cells;
   a first pair of bitline selection devices coupled to the programming-voltage node, the first pair of bitline selection devices capable of coupling the bitline pair to the programming-voltage level and configured to alternately couple a single bitline of the bitline pair at a time to the programming-voltage node;
   a latch capable of storing a single bit of coupling data; and
   a second pair of bitline selection devices coupled to the first pair of bitline selection devices, the bitline pair, and the latch, the second pair of bitline selection devices being configured to select the bitline pair based on the coupling data stored in the latch.

5. The memory-cell-programming system of claim 4, further comprising an address decoder means, coupled to the latch, for producing a logical-to-physical mapping of memory cell addresses to provide a logical address sequence corresponding to a sequence of physical addresses of either the even array of memory cells or the odd array of memory cells at a time.

6. The memory-cell-programming system of claim 4, further comprising a controller means, coupled to the latch, the programming-voltage node, and the first pair of bitline selection devices, for producing a correspondence of loading data to the latch, sequencing the programming-voltage level, and alternating a coupling of a single bitline at a time to the programming-voltage level.

7. An apparatus for programming a memory cell comprising:
   a pair of memory cell coupling means for providing programming voltages, a first one of the pair of memory cell coupling means being coupled to an even array of memory cells and a second one of the pair of memory cell coupling means being coupled to an odd array of memory cells;
   a first pair of bitline selection means for coupling to a programming-voltage node, the first pair of bitline selection means capable of coupling the pair of memory cell coupling means to a programming-voltage level and each one of the first pair of bitline selection means configured to alternately couple a single memory cell coupling means at a time to the programming-voltage node;
   a latching means for storing a single bit of coupling data; and
   a second pair of bitline selection means for coupling to the first pair of bitline selection means, the pair of memory cell coupling means, and the latching means, the second pair of bitline selection means being configured to select the pair of memory cell coupling means based on the coupling data stored in the latching means.

8. The apparatus for programming a memory cell of claim 7, further comprising an address decoding means, coupled to the latching means, for producing a logical-to-physical mapping of memory cell addresses to provide a logical address sequence corresponding to a sequence of physical addresses of either the even array of memory cells or the odd array of memory cells at a time.

9. The apparatus for programming a memory cell of claim 7, further comprising a controller means, coupled to the latching means, the programming-voltage node, and the first pair of bitline selection means, for producing a correspondence of loading data to the latching means, sequencing the programming-voltage level, and alternating a coupling of a single bitline at a time to a programming-voltage level.

10. A method of programming a memory cell array comprising:
    setting a bitline-coupling-control latch to a predetermined state;
    loading even-bitline-coupling-enable data to the bitline-coupling-control latch;
    erasing one or more pairs of memory cells coupled to a bitline pair;
    writing to an even bitline based on the even-bitline-coupling-enable data stored in the bitline-coupling-control latch;
    setting the bitline-coupling-control latch to the predetermined state;
    loading odd-bitline-coupling-enable data to the bitline-coupling-control latch; and
    writing to an odd bitline based on the odd-bitline-coupling-enable data stored in the bitline-coupling-control latch.

11. The method of programming a memory cell array of claim 10, further comprising reading an even bitline based on the even-bitline-coupling-enable data stored in the bitline-coupling-control latch and reading an odd bitline based on the odd-bitline-coupling-enable data stored in the bitline-coupling-control latch.

12. The method of programming a memory cell array of claim 10, further comprising mapping memory cell addresses in a logical address sequence corresponding to a sequence of physical addresses of either an even array of memory cells coupled to the even bitline or an odd array of memory cells coupled to the odd bitline at a time.

13. The method of programming a memory cell array of claim 10, further comprising loading even or odd bitline-coupling-enable data to the bitline-coupling-control latch, sequencing a programming-voltage level, and coupling a single bitline of a bitline pair at a time in alternation.

* * * * *